(12) United States Patent
Dvir et al.

(10) Patent No.: US 10,313,104 B2
(45) Date of Patent: Jun. 4, 2019

(54) SYSTEM AND METHOD FOR CONTROLLING THE IMPACT OF PERIODIC JITTER CAUSED BY NON-IDEAL PHASE INTERPOLATORS

(71) Applicant: Avago Technologies International Sales Pte. Limited, Singapore (SG)

(72) Inventors: Amiad Dvir, Irvine, CA (US); Mike Rolfe Ferrara, Petaluma, CA (US); Vitaly Zborovski, Herzliya Pituah (IL); Mario Caresosa, Irvine, CA (US); Ryan Hirth, Petaluma, CA (US); Assaf Naor, Herzliya Pituah (IL)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/707,665

(22) Filed: Sep. 18, 2017

(65) Prior Publication Data

US 2019/0089520 A1 Mar. 21, 2019

(51) Int. Cl.
*H04L 7/033* (2006.01)
*H04L 7/00* (2006.01)
*H04L 12/26* (2006.01)

(52) U.S. Cl.
CPC ............ *H04L 7/033* (2013.01); *H04L 7/0087* (2013.01); *H04L 43/087* (2013.01)

(58) Field of Classification Search
CPC ...... H04L 7/033; H04L 7/0087; H04L 43/087
See application file for complete search history.

(56) References Cited

U.S. PATENT DOCUMENTS

| 8,242,850 B2 * | 8/2012 | Tsangaropoulos ...... H03L 1/027 327/115 |
| 9,209,966 B1 * | 12/2015 | Hossain .................. H03L 7/087 |

\* cited by examiner

*Primary Examiner* — Vineeta S Panwalkar
(74) *Attorney, Agent, or Firm* — Foley & Lardner LLP

(57) ABSTRACT

In some aspects, the disclosure is directed to methods and systems for controlling periodic jitter arising from a phase interpolator (PI). A receiver can receive incoming data. A fractional-N phase-locked loop (PLL) can receive a reference clock. Measurement circuitry can measure a parts per million (PPM) offset between the incoming data and the reference clock, of a PI. The fractional-N PLL can restrict jitter arising from the PI, to frequencies within a predefined bandwidth, by tuning a center frequency of the fractional-N PLL to reduce the PPM offset of the PI.

20 Claims, 10 Drawing Sheets

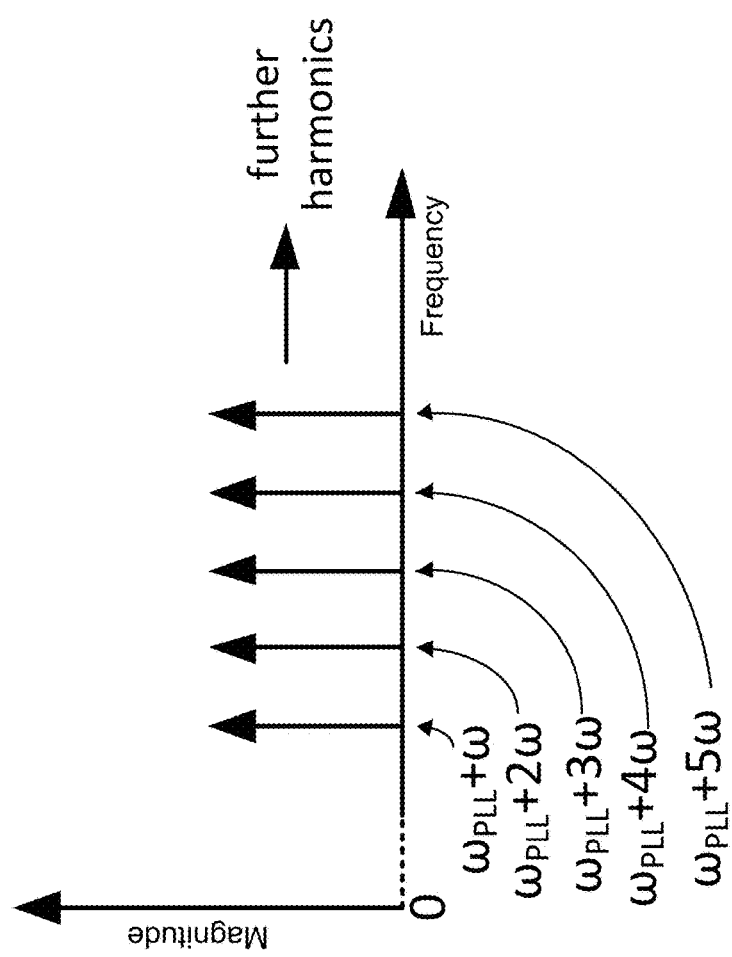

SYSTEM AND METHOD FOR CONTROLLING THE IMPACT OF PERIODIC JITTER CAUSED BY NON-IDEAL PHASE INTERPOLATORS

FIELD OF THE DISCLOSURE

This disclosure generally relates to systems and methods for controlling the impact of jitter of a communications system, including but not limited to systems and methods for controlling the impact of periodic jitter caused by phase interpolators.

BACKGROUND OF THE DISCLOSURE

A data transceiver architecture using serializer/deserializer (SERDES) often employs phase interpolators or similar functional circuits to offset a transmit (or receive) frequency relative to a local timing reference so that the SERDES can transmit (or receive) data at the same frequency as a frequency of data transmitted (or received) from its far-end peer device as detected by a SERDES receiver (or transmitter).

Phase interpolators (PIs) are devices that can input a clock and shift its phase according to an analog or digital command. A PI can be used to achieve a TX (or RX) frequency that is different from a frequency of a phase locked loop (PLL) or a frequency of a PLL multiple. Improvements in such PI-based data receiving/transmitting methods remain desired.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 2C is a block diagram depicting a spectrum of an ideal PI modulating a PLL when the PI linearly shifts phase at a fixed rate;

The details of various embodiments of the methods and systems are set forth in the accompanying drawings and the description below.

DETAILED DESCRIPTION

For purposes of reading the description of the various embodiments below, the following descriptions of the sections of the specification and their respective contents can be helpful:

Section A describes a network environment and computing environment which can be useful for practicing embodiments described herein; and Section B describes embodiments of systems and methods for controlling the impact of periodic jitter caused by non-ideal phase interpolators.

A. Computing and Network Environment

Figure 1A:
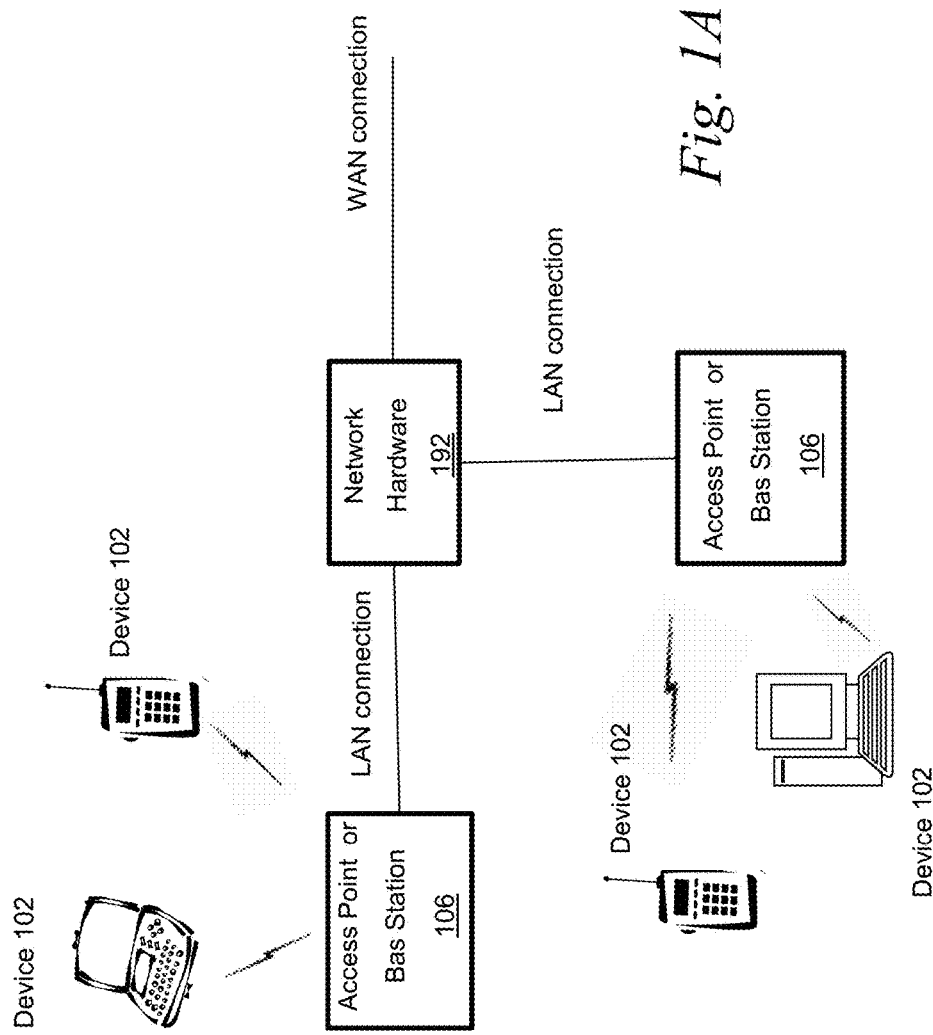
FIG. 1A is a block diagram depicting an embodiment of a network environment including one or more wireless communication devices in communication with one or more devices or stations.

Prior to discussing specific embodiments of the present solution, aspects of the operating environment as well as associated system components (e.g., hardware elements) are described in connection with the methods and systems described herein. Referring to FIG. 1A, an embodiment of a network environment is depicted. In brief overview, the network environment includes a wireless communication system that includes one or more base stations 106, one or more wireless communication devices 102 and a network hardware component 192. The wireless communication devices 102 can for example include laptop computers 102, tablets 102, personal computers 102 and/or cellular telephone devices 102. The details of an embodiment of each wireless communication device and/or base station are described in greater detail with reference to FIGS. 1B and 1C. The network environment can be an ad hoc network environment, an infrastructure wireless network environment, a subnet environment, etc., in one embodiment.

Terms such as "wireless communication device", "user equipment," "mobile station," "mobile," "mobile device," "subscriber station," "subscriber equipment," "access terminal," "terminal," "handset," and similar terminology, can refer to a wireless device utilized by a subscriber or user of a wireless communication service to receive or convey data, control, voice, video, sound, gaming, or substantially any data-stream or signaling-stream. The foregoing terms can be utilized interchangeably in the present disclosure. Likewise, terms such as "access point (AP)," "wireless access point (WAP)," "base station," "base transceiver station", "Node B," "evolved Node B (eNode B or eNB)," home Node B (HNB)," "home access point (HAP)," and similar terminology, can be utilized interchangeably in the present disclosure, and refer to a wireless network component or apparatus that serves and receives data, control, voice, video, sound, gaming, or substantially any data-stream or signaling-stream from a set of wireless devices.

Referring again to FIG. 1A, the base stations 106 can be operably coupled to the network hardware 192 via local area network connections. The network hardware 192, which can include a router, gateway, switch, bridge, modem, system controller, appliance, etc., can provide a local area network connection for the communication system. Each of the base stations 106 can have an associated antenna or an antenna array to communicate with the wireless communication devices 102 in its area. The wireless communication devices 102 can register with a particular access point 106 to receive services from the communication system (e.g., via a SU-MIMO or MU-MIMO configuration). For direct connections (e.g., point-to-point communications), some wireless communication devices 102 can communicate directly via an allocated channel and communications protocol. Some of the wireless communication devices 102 can be mobile or relatively static with respect to the access point 106.

In one or more embodiments, a base station 106 includes a device or module (including a combination of hardware and software) that allows wireless communication devices 102 to connect to a wired network using LTE, Wi-Fi, and/or other standards. A base station 106 can be implemented, designed and/or built for operating in a wireless local area network (WLAN), such as in a cellular network. A base station 106 can connect to a router (e.g., via a wired network) as a standalone device in one or more embodiments. In other embodiments, a base station can be a component of a router. A base station 106 can provide multiple devices 102 access to a network. A base station 106 can, for example, connect to a wired Ethernet connection and provide wireless connections using radio frequency links for other devices 102 to utilize that wired connection. A base station 106 can be built and/or implemented to support a standard for sending and receiving data using one or more radio frequencies. Those standards and the frequencies they use can be defined by the IEEE or 3GPP for example. A base station 106 can be implemented and/or used to support cellular coverage, public Internet hotspots, and/or on an internal network to extend the network's signal (e.g., Wi-Fi) range.

In one or more embodiments, the base stations 106 can be used for (e.g., in-home or in-building) wireless networks (e.g., IEEE 802.11, Bluetooth, ZigBee, cellular, any other type of radio frequency based network protocol and/or variations thereof). Each of the wireless communication devices 102 can include a built-in radio and/or is coupled to a radio. Such wireless communication devices 102 and/or base stations 106 can operate in accordance with the various aspects of the disclosure as presented herein to enhance performance, reduce costs and/or size, and/or enhance broadband applications. Each wireless communication devices 102 can have the capacity to function as a client node seeking access to resources (e.g., data, and connection to networked nodes such as servers) via one or more base stations 106.

The network connections can include any type and/or form of network and can include any of the following: a point-to-point network, a broadcast network, a telecommunications network, a data communication network, a computer network. The topology of the network can be a bus, star, or ring network topology. The network can be of any such network topology as known to those ordinarily skilled in the art capable of supporting the operations described herein. In one or more embodiments, different types of data can be transmitted via different protocols. In other embodiments, the same types of data can be transmitted via different protocols.

Figure 1B:
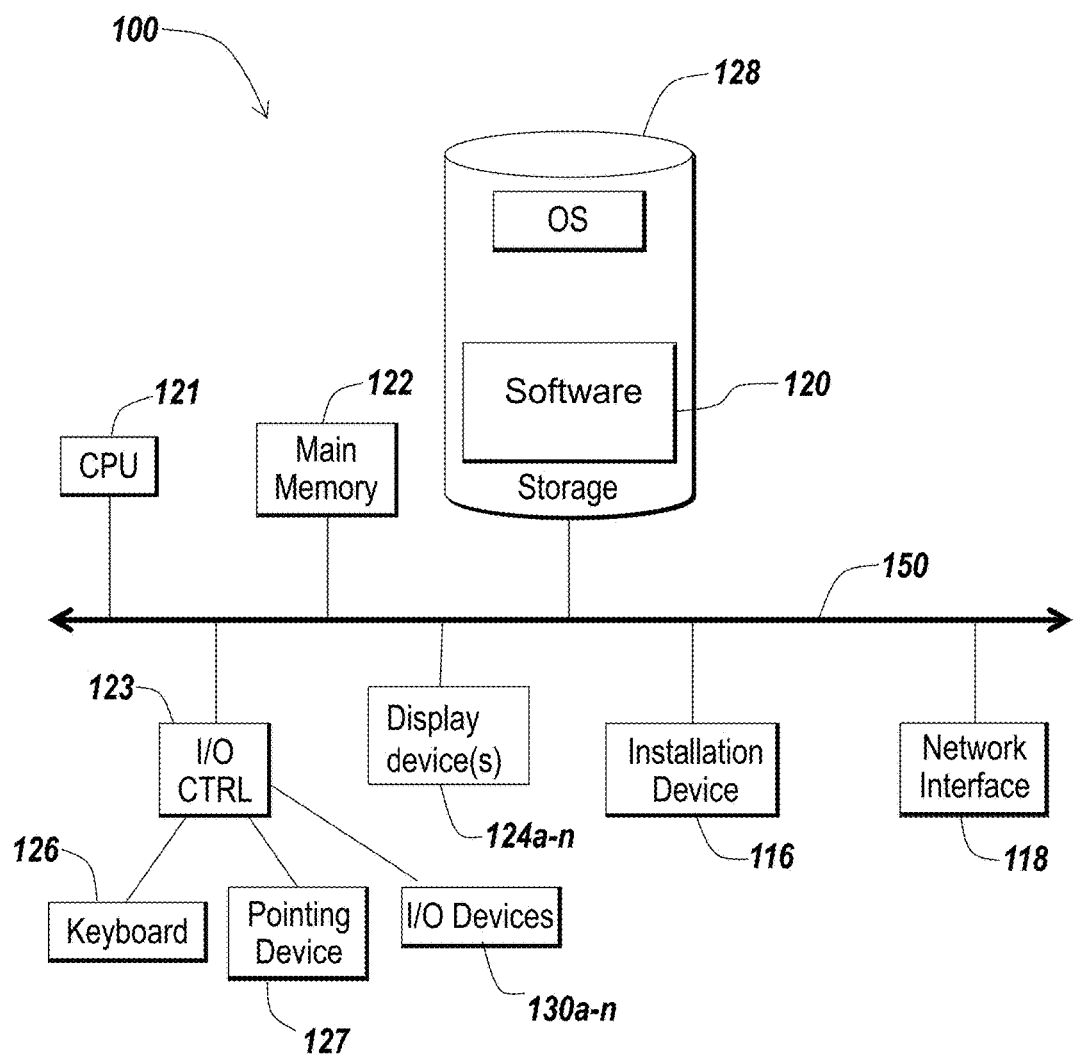
FIGS. 1B and 1C are block diagrams depicting embodiments of computing devices useful in connection with the methods and systems described herein.
Figure 1C:
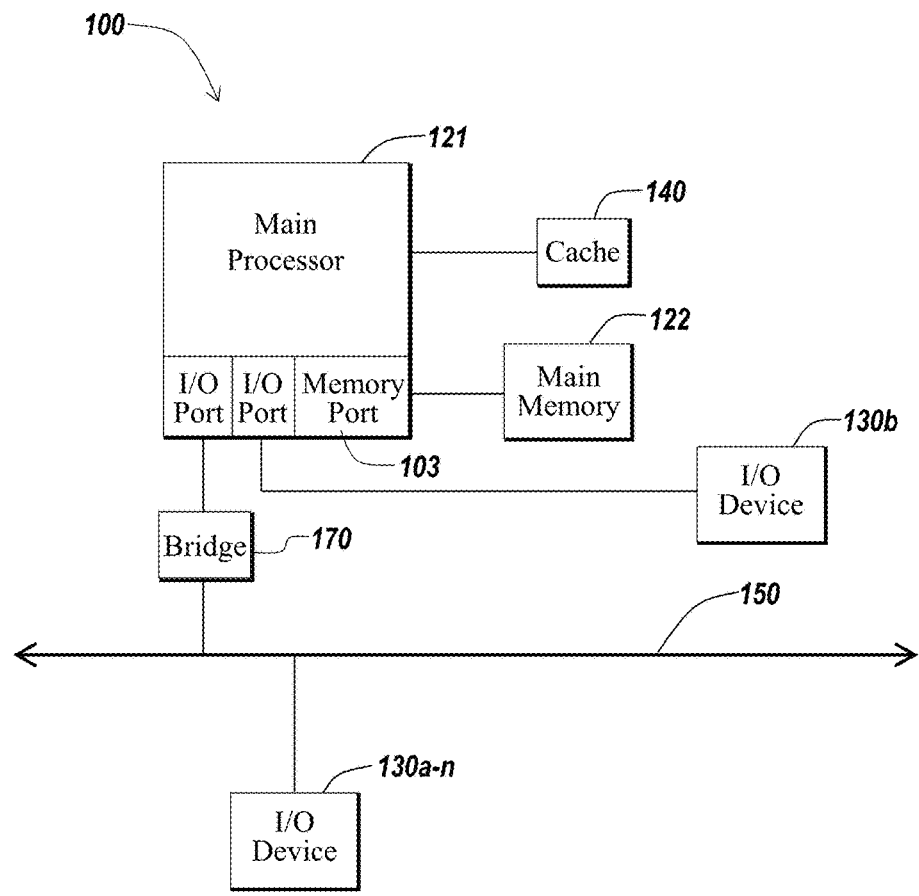

The communications device(s) 102 and base station(s) 106 can be deployed as and/or executed on any type and form of computing device, such as a computer, network device or appliance capable of communicating on any type and form of network and performing the operations described herein. FIGS. 1B and 1C depict block diagrams of a computing device 100 useful for practicing an embodiment of the wireless communication devices 102 or the base station 106. As shown in FIGS. 1B and 1C, each computing device 100 includes a central processing unit 121, and a main memory unit 122. As shown in FIG. 1B, a computing device 100 can include a storage device 128, an installation device 116, a network interface 118, an I/O controller 123, display devices 124a-124n, a keyboard 126 and a pointing device 127, such as a mouse. The storage device 128 can include, without limitation, an operating system and/or software. As shown in FIG. 1C, each computing device 100 can also include additional optional elements, such as a memory port 103, a bridge 170, one or more input/output devices 130a-130n (generally referred to using reference numeral 130), and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, such as: those manufactured by Intel Corporation of Mountain View, Calif.; those manufactured by International Business Machines of White Plains, N.Y.; those manufactured by ARM Holdings, plc of Cambridge, England. or those manufactured by Advanced Micro Devices of Sunnyvale, Calif. The computing device 100 can be based on any of these processors, or any other processor capable of operating as described herein.

Main memory unit 122 can be one or more memory chips capable of storing data and allowing any storage location to be directly accessed by the microprocessor 121, such as any type or variant of Static random access memory (SRAM), Dynamic random access memory (DRAM), Ferroelectric RAM (FRAM), NAND Flash, NOR Flash and Solid State Drives (SSD). The main memory 122 can be based on any of the above described memory chips, or any other available memory chips capable of operating as described herein. In the embodiment shown in FIG. 1B, the processor 121 communicates with main memory 122 via a system bus 150 (described in more detail below). FIG. 1C depicts an embodiment of a computing device 100 in which the processor communicates directly with main memory 122 via a memory port 103. For example, in FIG. 1C the main memory 122 can be DRDRAM.

FIG. 1C depicts an embodiment in which the main processor 121 communicates directly with cache memory 140 via a secondary bus, sometimes referred to as a backside bus. In other embodiments, the main processor 121 communicates with cache memory 140 using the system bus 150. Cache memory 140 typically has a faster response time than main memory 122 and is provided by, for example, SRAM, BSRAM, or EDRAM. In the embodiment shown in FIG. 1C, the processor 121 communicates with various I/O devices 130a-n via a local system bus 150. Various buses can be used to connect the central processing unit 121 to any of the I/O devices 130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the processor 121 can use an Advanced Graphics Port (AGP) to communicate with the display 124. FIG. 1C depicts an embodiment of a computer 100 in which the main processor 121 can communicate directly with I/O device 130b, for example via HYPERTRANSPORT, RAPIDIO, or INFINIBAND communications technology. FIG. 1C also depicts an embodiment in which local busses and direct communication are mixed: the processor 121 communicates with I/O device 130a using a local interconnect bus while communicating with I/O device 131 directly.

A wide variety of I/O devices 130a-n and 131 can be present in the computing device 100. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices 130a-n can be controlled by an I/O controller 123 as shown in FIG. 1B. The I/O controller can control one or more I/O devices such as a keyboard 126 and a pointing device 127, e.g., a mouse or optical pen. Furthermore, an I/O device can also provide storage and/or an installation medium 116 for the computing device 100. In still other embodiments, the computing device 100 can provide USB connections (not shown) to receive handheld USB storage devices such as the USB Flash Drive line of devices manufactured by Twintech Industry, Inc. of Los Alamitos, Calif.

Referring again to FIG. 1B, the computing device 100 can support any suitable installation device 116, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 100 can further include a storage device, such as one or more hard disk drives or redundant arrays of independent disks, for storing an operating system and other related software, and for storing application software programs such as any program or software 120 for implementing (e.g., built and/or designed for) the systems and methods described herein. Optionally, any of the installation devices 116 could also be used as the storage device. Additionally, the operating system and the software can be run from a bootable medium.

Furthermore, the computing device 100 can include a network interface 118 to interface to the network 104 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax, LTE, LTE-A and direct asynchronous connections). In one embodiment, the computing device 100 communicates with other computing devices 100' via any type and/or form of gateway or tunneling protocol such as Secure Socket Layer (SSL) or Transport Layer Security (TLS). The network interface 118 can include a built-in network adapter, network interface card, PCMCIA network card, card bus network adapter, wireless network adapter, USB network adapter, modem or any other device suitable for interfacing the computing device 100 to any type of network capable of communication and performing the operations described herein.

In one or more embodiments, the computing device 100 can include or be connected to one or more display devices 124a-124n. As such, any of the I/O devices 130a-130n and/or the I/O controller 123 can include any type and/or form of suitable hardware, software, or combination of hardware and software to support, enable or provide for the connection and use of the display device(s) 124a-124n by the computing device 100. For example, the computing device 100 can include any type and/or form of video adapter, video card, driver, and/or library to interface, communicate, connect or otherwise use the display device(s) 124a-124n. In one embodiment, a video adapter can include multiple connectors to interface to the display device(s) 124a-124n. In other embodiments, the computing device 100 can include multiple video adapters, with each video adapter connected to the display device(s) 124a-124n. In one or more embodiments, any portion of the operating system of the computing device 100 can be implemented for using multiple displays 124a-124n. One ordinarily skilled in the art will recognize and appreciate the various ways and embodiments that a computing device 100 can be implemented to have one or more display devices 124a-124n.

In further embodiments, an I/O device 130a-n can be a bridge between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 100 of the sort depicted in FIGS. 1B and 1C can operate under the control of an operating system, which control scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Wash.; MAC OS, produced by Apple Computer of Cupertino, Calif.; WebOS, produced by Research In Motion (RIM); OS/2, produced by International Business Machines of Armonk, N.Y.; and Linux, a freely-available operating system distributed by Caldera Corp. of Salt Lake City, Utah, or any type and/or form of a Unix operating system, among others.

The computer system 100 can be any workstation, telephone, sensor, desktop computer, laptop or notebook computer, server, handheld computer, mobile telephone, or other portable telecommunications device, media playing device, a gaming system, mobile computing device, or any other type and/or form of computing, telecommunications or media device that is capable of communication. The computer system 100 has sufficient processor power and memory capacity to perform the operations described herein.

In one or more embodiments, the computing device 100 can have different processors, operating systems, and input devices consistent with the device. For example, in one embodiment, the computing device 100 is a smart phone, mobile device, tablet or personal digital assistant. In still other embodiments, the computing device 100 is an Android-based mobile device, an iPhone smart phone manufactured by Apple Computer of Cupertino, Calif., or a Blackberry or WebOS-based handheld device or smart phone, such as the devices manufactured by Research In Motion Limited. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Aspects of the operating environments and components described above will become apparent in the context of the systems and methods disclosed herein.

B. Controlling the Impact of Periodic Jitter Caused by Phase Interpolators

Described herein are systems and methods for controlling the impact of periodic jitter caused by non-ideal phase interpolators. In one or more embodiments, a phase interpolator is a programmable phase shifter of a phase locked loop (PLL) clock, which continuously shifts a phase at a fixed rate, and in effect shifts the frequency of the PLL clock. In one or more embodiments, by using phase interpolators, a SERDES device tracks changes in frequency of data as detected by a SERDES receiver. These phase shifting and tracking circuits often suffer from flaws including, but not limited to, quantization errors, imbalance, etc., that result in spurious periodic jitter imparted on transmitted signals. These spurious signals often impact link quality and are therefore regulated by standards.

Jitter is any deviation in, or displacement of, the signal pulses in a high-frequency digital signal. In other words, jitter corresponds to time domain instabilities. Jitter has two characteristics: (1) frequency components of the variations; and (2) amplitude (e.g., amplitude of time components of the variation. When analyzing jitter of a serial data or a clock, signals are compared with some "clean" (or noise-free) signal or clock that is a reference point. In one or more embodiments, to measure jitter of a serial data, an average ideal clock that is relevant to the serial data is measured.

Many modern standards for high speed serial communications links demand spectrally pure clocking (e.g., clocking with low phase-noise), while they do not demand a certain frequency precision, which would lead to a functional requirement of shifting frequency. In one or more embodiments, a receiving device of a link is equipped with a clock and data recovery unit (CDR unit) which checks if an incoming serial data clock to be recovered is within a certain bandwidth (e.g., BW1) in a frequency spectrum. Most standards for high speed serial communications links also adopt an approach specifying transmitted jitter within an operational bandwidth (e.g., BW2) in the frequency spectrum. In one or more embodiments, if BW2>BW1, the CDR unit starts operation based on the minimum bandwidth requirement (e.g., BW1).

In some aspects, the present disclosure provides embodiments of a method that achieves frequency shifts analogous to that provided by a phase interpolator, while moving spurious periodic jitter to another location in a frequency spectrum where the jitter can be rendered harmless to the transmitted signals and/or can be more easily controlled. In one or more embodiments, the present solution moves spurious periodic jitter caused by a phase interpolator (PI) from its original frequency location (or its original frequency range) in the spectrum to a frequency location (or a frequency range) in the spectrum lower than the original frequency. In one or more embodiments, the present solution moves spurious periodic jitter caused by a PI from its original frequency location (or its original frequency range) in the spectrum to a frequency location (or a frequency range) in the spectrum higher than the original frequency.

In one or more embodiments, the disclosure is directed to a method for controlling periodic jitter arising from PI. In one or more embodiments, the method includes receiving incoming data. A reference clock of a fractional-N phase-locked loop (PLL) is received, in one or more embodiments. In one or more embodiments, a parts per million (PPM) offset of a PI is measured between the incoming data and the reference clock. Jitter arising from the PI is restricted to frequencies within a predefined bandwidth, by tuning a center frequency of the fractional-N PLL to reduce the PPM offset of the PI, in one or more embodiments. In one or more embodiments, the PPM offset of the PI is reduced to a target value or to be within a target value range. In one or more embodiments, the jitter arising from the PI is reduced by reducing a frequency shift of the PI or a frequency shift required by the PI. The jitter arising from the PI is reduced by shifting at least a component of the jitter to reside outside of a predefined frequency range, in one or more embodiments. In one or more embodiments, clock and data recovery (CDR) is performed using the incoming data and the reference clock. The incoming data is received from a high speed serial communications link, in one or more embodiments. In tuning a center frequency of the fractional-N PLL, the center frequency is adjusted to or towards a desired frequency for transmitting outgoing data, in one or more embodiments.

In one or more embodiments, the disclosure is directed to a method for controlling periodic jitter arising from a PI using a digital-analog converter (DAC). In one or more embodiments, the method includes receiving incoming data. A reference clock of a PLL is received, in one or more embodiments. In one or more embodiments, a PPM offset of the PI is measured between the incoming data and the reference clock. Jitter arising from the PI is restricted to frequencies within a predefined bandwidth, by tuning a center frequency of the PLL using a DAC to reduce the PPM offset of the PI, in one or more embodiments. In one or more embodiments, the method includes reducing the PPM offset of the PI to a target value or to be within a target value range. The jitter arising from the PI is reduced by reducing a frequency shift of the PI or a frequency shift required by the PI, in one or more embodiments. In one or more embodiments, the jitter arising from the PI is reduced by shifting a component of the jitter to reside outside of a predetermined frequency range. In one or more embodiments, CDR is performed using the incoming data and the reference clock. The incoming data is received from a high speed serial communications link, in one or more embodiments. In restricting jitter arising from the PI, to frequencies within a predefined bandwidth, a configuration of the DAC is set in a continuous mode, in one or more embodiments.

In one or more embodiments, the disclosure is directed to a system for controlling periodic jitter arising from a PI. In one or more embodiments, the system includes a receiver, a fractional-N PLL, and measurement circuitry. The receiver receives incoming data, in one or more embodiments. In one or more embodiments, the fractional-N PLL receives a reference clock. The measurement circuitry measures a PPM offset of a PI between the incoming data and the reference clock, in one or more embodiments. In one or more embodiments, the fractional-N PLL restricts jitter arising from the PI, to frequencies within a predefined bandwidth, by tuning a center frequency of the PLL to reduce the PPM offset of the PI. In one or more embodiments, the fractional-N PLL reduces the PPM offset of the PI to a target value or to be within a target value range. The fractional-N PLL reduces the jitter arising from the PI by reducing a frequency shift of the PI or a frequency shift required by the PI, in one or more embodiments. In one or more embodiments, the fractional-N PLL reduces the jitter arising from the PI by shifting a component of the jitter to reside outside of a predetermined frequency range. The receiver receives the incoming data from a high speed serial communications link, in one or more embodiments. In one or more embodiments, the fractional-N PLL tunes a center frequency of the PLL by adjusting the center frequency to or towards a desired frequency for transmitting outgoing data.

Figure 2A:
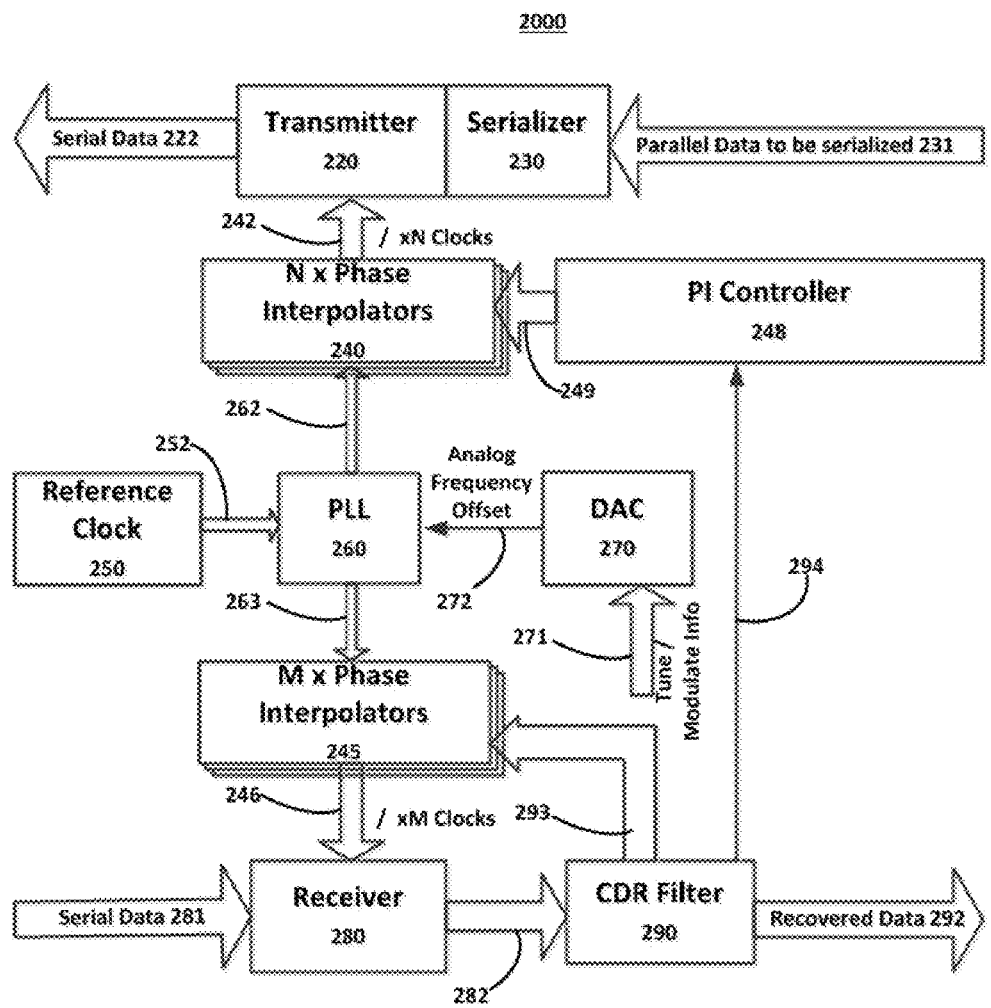
FIG. 2A is a block diagram depicting an embodiment of a system for controlling the impact of periodic jitter caused by non-ideal phase interpolators.

Referring to FIG. 2A, an illustrative embodiment of a system 2000 for controlling periodic jitter arising from a PI is depicted. In one or more embodiments, the system 2000 includes a receiver 280, a CDR filter 290, an M-phase PI 245 for generating M clocks 246 (M: integer), a reference clock 250, a PLL 260, a digital-to-analog converter (DAC) 270, an N-phase PI 240 for generating N clocks 242 (N: integer), a PI controller 248, a serializer 230, and/or a transmitter 220.

In one or more embodiments, the reference clock 250 generates a reference clock signal 252. In one or more embodiments, the PLL 260 receives the reference clock signal 252 to lock to a reference frequency of the reference clock signal 252. In one or more embodiments, the PLL 260 includes a phase detector, a charge pump, a low pass filter, and/or a voltage controlled oscillator (VCO). In one or more embodiments, an output voltage of the low pass filter is a control voltage for the VCO so that the VCO generates a clock 262 or 263 having a frequency that is determined by the control voltage. In one or more embodiments, the frequency control uses an analog filtration (e.g., a low pass filter) at the input to the VCO of the PLL 260. In one or more embodiments, the PLL 260 is a fractional-N phase-locked loop configured to receive a reference signal and provide a proportional signal and an integral signal. In one or more embodiments, an offset to the reference clock of the fractional-N PLL is achieved by obtaining a division of the VCO's frequency and comparing the division to the reference clock to generate a signal that drives an analog filter (e.g., a low pass filter of the PLL 260).

In one or more embodiments, the analog filter of the PLL is replaced by a DAC (e.g., the DAC 270). In one or more embodiments, the DAC 270 receives a digital input 271 for tuning and/or modulation. In one or more embodiments, the DAC 270 outputs an analog frequency offset 272 to an input of the VCO so that the VCO generates a clock 262 or 263 having a frequency that is determined by the analog frequency offset 272. In one or more embodiments, a center frequency of the PLL is a center frequency of the VCO.

In one or more embodiments, the M-phase PI 245 receives the clock 263 generated from the VCO. In one or more embodiments, the M-phase PI 245 continuously rotates the phase of the generated clock at an angular speed to generate M clocks (with M rotated clock phases). In one or more embodiments, the continuous phase rotation by the M-phase PI 245 implements fine frequency tuning, since frequency is the derivative of phase. In one or more embodiments, the M-phase PI 245 outputs the generated M different clocks 246 to the receiver 280. In one or more embodiments, the M-phase PI 245 has K number of phase steps (e.g., K=64, 128, etc.) and outputs M different clocks (e.g., M=2, 4, 8, etc.). In one or more embodiments, the receiver 280 receives serial data stream 281. In one or more embodiments, the receiver receives the serial data stream 281 (as the incoming data) from a high speed serial communications link. In one or more embodiments, the M clock phases 246, together with the serial data stream 281 are input to the CDR filter 290. In one or more embodiments, a PI includes a phase moving element that is capable of dynamically moving the phase of the clock generated from the VCO of the PLL 260 (e.g., the generated clock 262 or 263).

In one or more embodiments, the N-phase PI 240 receives the clock 263 generated from the VCO of the PLL 260. In one or more embodiments, the N-phase PI 240 continuously rotates the phase of the generated clock at an angular speed to generate N different clocks. In one or more embodiments, the N-phase PI 240 has L number of phase steps (e.g., L=64, 128, etc.) and outputs N different clocks (e.g., N=2, 4, 8, etc.). In one or more embodiments, the continuous phase rotation by the N-phase PI 240 implements fine frequency tuning, since frequency is the derivative of phase. In one or more embodiments, the N-phase PI 240 outputs the generated N clock phases 242 to the transmitter 220. In one or more embodiments, the serializer 230 receives parallel data 231 and serializes the received data. In one or more embodiments, the transmitter 220 transmits the serialized data as seral data 222 using the N clock 242 generated from the N-phase PI 240.

In one or more embodiments, the CDR filter 290 receives the serial data stream 281 and produces recovered (or retimed) data 292. In one or more embodiments, the CDR filter 290 includes a phase detector which detects data stream transitions and selects a phase associated with the transition detection. In one or more embodiments, the CDR filter 290 detects any phase or frequency offset between the incoming serial data (e.g., the serial data stream 281) and a lock clock (e.g., the reference clock signal 252, generated clock 262 or 263, or PI output clock 242 or 246). In one or more embodiments, the CDR filter 290 includes measurement circuitry configured to measure a frequency difference between the incoming data and a local clock (e.g., reference clock signal 252, generated clock 262 or 263, or PI output clock 242 or 246). In one or more embodiments, the CDR filter 290 measures the frequency difference between the incoming data and the local clock in part per million (PPM) as a PPM offset of a PI (e.g., the M-phase PI 245). In one or more embodiments, the CDR filter 290 measures the frequency difference between the incoming data and the local clock in other measurement units (e.g., any ratio or absolute terms).

In one or more embodiments, the PI controller 248 includes a phase detector and a clock and phase error detector coupled to the phase detector. In one or more embodiments, the clock and phase error detector includes measurement circuitry configured to measure a PPM offset of a PI (e.g., the N-phase PI 240) between the incoming data and a local clock (e.g., reference clock signal 252). In one or more embodiments, to compensate for frequency offset and phase offset between the incoming data and a local PLL clock (e.g., the PPM offset between the incoming data and the reference clock), the clock and phase error detector of the PI controller 248 outputs a control signal 249 to instruct the PI (e.g., the N-phase PI 240) to move to a next phase step (or perform a phase-rotating using a phase rotator). In one or more embodiments, the PI is a phase rotator configured to perform phase-rotating. In one or more embodiments, a CDR filter (e.g., the CDR filter 290) instructs a PI (e.g., the N-phase PI 240) to move its phase appropriately (in any combination of proportional ratio and/or integration) to achieve a fixed phase and frequency relationship (or difference or offset) between the clock output from the PI and the incoming data. In one or more embodiments, the clock and phase error detector of the PI controller 248 receives from the CDR filter 290 an input signal 294 (which, for example, indicates the PPM offset between the incoming data and the reference clock, if the PPM offset is measured by the measurement circuitry of the CDR filter 290) and outputs the control signal 249 to instruct the PI to move to a next phase step (or perform a phase-rotating using a phase rotator). In one or more embodiments, the clock and phase error detector includes logical cells that detect phase error, contains a filter that counts frequency offset, and is responsible to drive the PI. In one or more embodiments, the clock and phase error detector is included in the CDR filter 290. In one or more embodiments, the control signal 249 includes a PI control code so that the PI produces a corresponding output phase based on the PI control code. For example, if the number of possible output phases is 64 (e.g., N=64 in the N-phase PI 240), the control signal may include a PI control code "16" so that the PI produces $16^{th}$ phase of 64 possible output phases based on the PI control code.

Figure 2B:
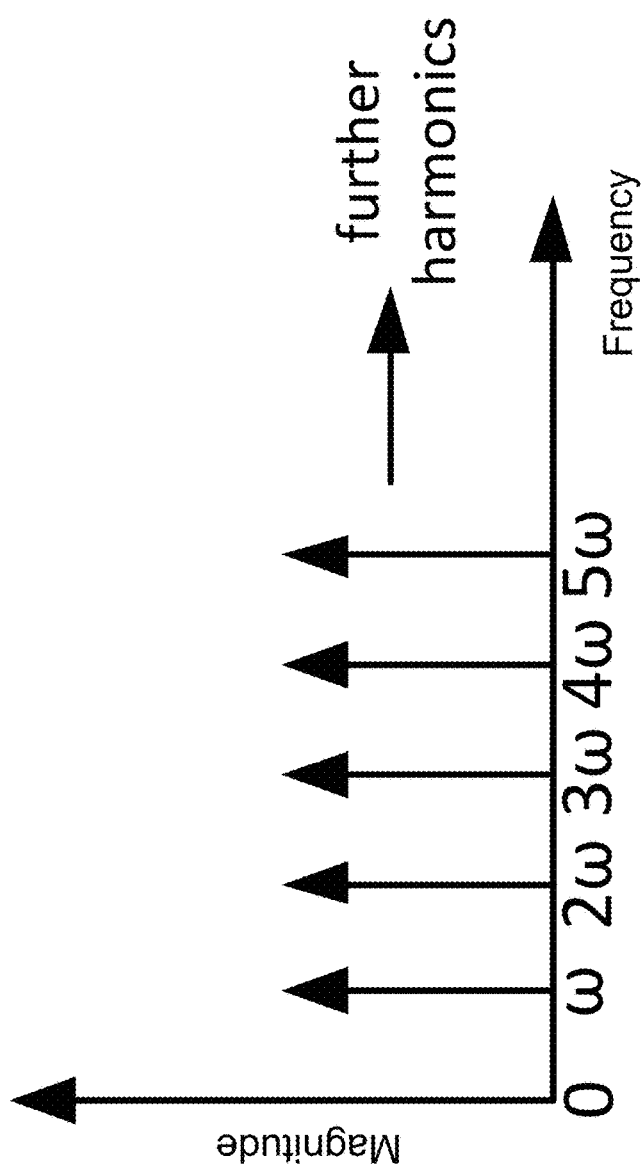
FIG. 2B is a block diagram depicting a frequency spectrum of an ideal PI.

Referring to FIG. 2B, a frequency spectrum of an ideal PI is depicted. Ideally, a PI has a flaw-free, linear response. In reality, however, the PI is quantized and exhibits quantization errors and errors related to an imbalance due to structures and fundamental limitations of a device. In an ideal and linear PI, there are infinite (phase) steps, each phase step being identical to the last one. An ideal and linear PI also shows an identical response to harmonics in the frequency spectrum. For example, as shown in FIG. 2B, an ideal and linear PI shows an identical amplitude at different harmonic frequencies (e.g., 2ω, 3ω, 4ω, 5ω, etc.) of a fundamental frequency ω.

FIG. 2C depicts a spectrum of an ideal PI modulating the PLL, when the PI linearly shifts phase at a fixed rate. If the frequency of a PLL is denoted by $F_1(t)=Ae^{i\omega t}$, the frequency of the PLL combined with an ideal PI's steady movement is denoted by $F_2(t)=Ae^{i(\omega t+PI(t))}$ where PI(t) is a phase interpolator phase as a function of time, which is linear with a rate of change that is the difference between a locally generated frequency and a target frequency. The spectrum of $F_2(t)$ is related to the spectrum of the PI such that its spectrum is the PI spectrum translated to the PLL frequency ($\omega_{PLL}$). An ideal and linear PI shows an identical response to harmonics in the frequency spectrum. For example, as shown in FIG. 2C, an ideal and linear PI shows an identical amplitude at different frequencies (e.g., $\omega_{PLL}+\omega$, $\omega_{PLL}+2\omega$, $\omega_{PLL}+3\omega$, $\omega_{PLL}+4\omega$, $\omega_{PLL}+5\omega$, etc.) that modulate the PLL (whose frequency is $\omega_{PLL}$), when linearly shifting phase at a fixed rate.

Figure 2D:
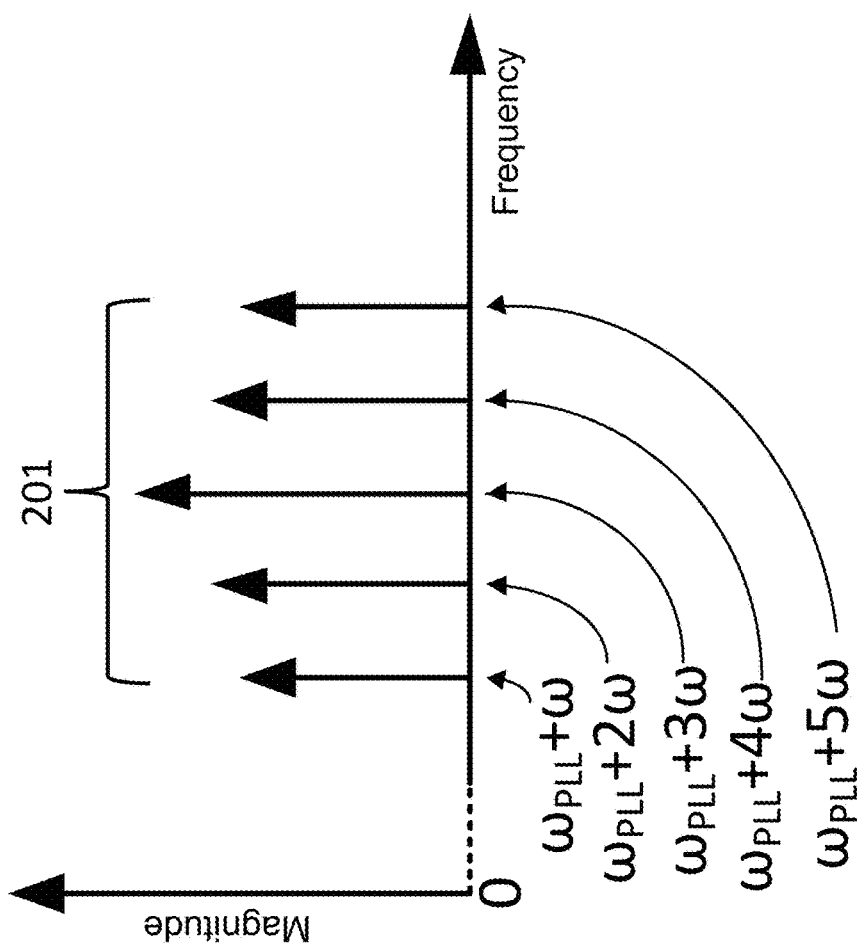
FIG. 2D is a block diagram depicting a spectrum of a non-ideal PI modulating a PLL.

FIG. 2D depicts one embodiment of a spectrum of a non-ideal PI modulating a PLL. If a phase of the PI is not perfect or identical (for example, a phase of the PI is not identical either in phase adjustment linearity or rate of phase shift), the non-ideal PI step deviates from an ideal linear movement and generates a dissonance in the phase movement. The dissonance generates a phase error, which lasts as long as that phase error is in place. In one or more embodiments, this error phenomenon is localized to specific code setting in the non-ideal PI. For instance, in one or more embodiments, by setting a PI control code properly, this error phenomenon can be avoided. In one or more embodiments, if the non-ideal PI constantly moves to generate a new frequency of the clock, this error is constantly present at a unique frequency so that a unique frequency offset to the newly generated clock exists in the spectrum.

When such non-idealities are present in the PI, the PI produces a frequency shift or a phase error, which manifests as phase modulation. For example, if a PI has 10 optional phases in one cycle in its movement setting, the phase position following the PI position-9 is the PI position-0. If the PI makes 11 PI movements "forward" in a total time of 1 second, one clock cycle is added to the clock over that second. If the PI makes 11 PI movements "forward" every second, it changes the clock frequency by 1 Hertz. In some case, a complete clock cycle of movement in a non-ideal PI includes a complete pass through all of the phase positions of the PI with respective phase errors. For example, if the PI passes through a complete clock cycle in 1 second (and all of the phase positions are subject to phase error), it manifests the phase nonlinearity as a spurious signal (e.g., periodic jitter) at integral multiples of 1 Hz offset from the output frequency, in one or more embodiments. Similarly, a 0.1 second sweep through the phase positions (if all of the phase positions are subject to phase error) generates a spurious signal (periodic jitter) at integral multiples of a 10 Hz offset from the output frequency, in one or more embodiments.

A non-ideal and non-linear PI shows different responses to harmonics in the frequency spectrum due to phase noise generated by PI's non-linearities, in one or more embodiments. FIG. 2D shows an example of phase noise generated by PI's non-linearities. As shown in FIG. 2C, due to spurious signals or phase noise (e.g., periodic jitter) caused by phase errors, a non-ideal and non-linear PI shows different amplitudes at different frequencies of the PLL (whose frequency is $\omega_{PLL}$) combined with a non-ideal PI's phase movement, in a particular frequency range (e.g., in FIG. 2D, the frequency range 201 including $\omega_{PLL}+\omega$, $\omega_{PLL}+2\omega$, $\omega_{PLL}+3\omega$, $\omega_{PLL}+4\omega$, $\omega_{PLL}+5\omega$).

Figure 2E:
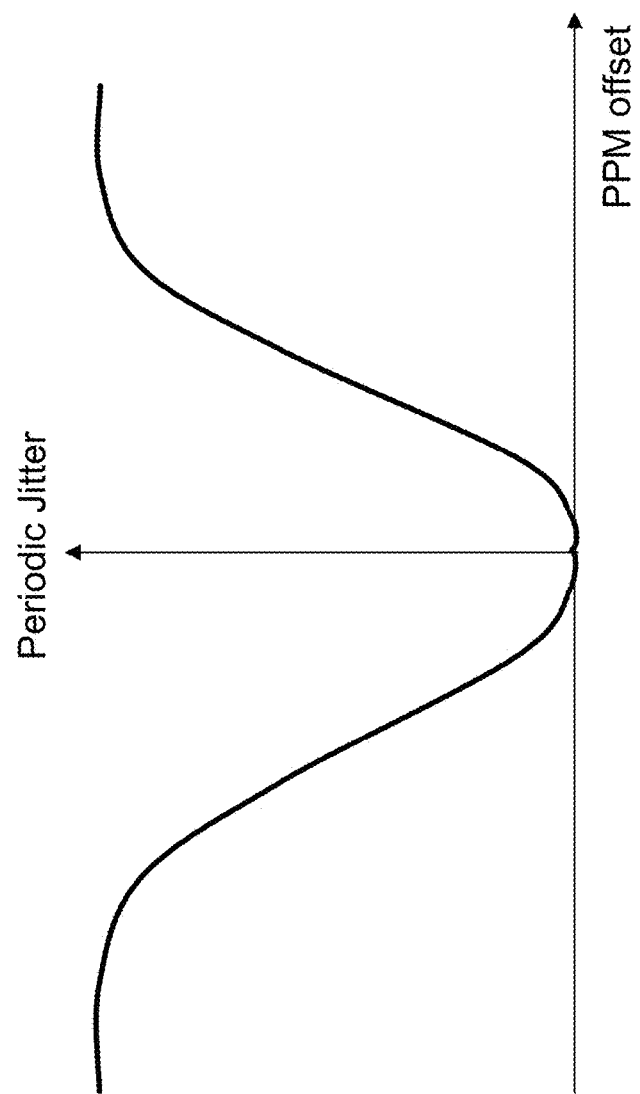
FIG. 2E is a block diagram depicting a relationship between periodic jitter and a parts per million (PPM) offset.

FIG. 2E is a block diagram depicting a relationship between periodic jitter and a parts per million (PPM) offset. In one or more embodiments, as shown in FIG. 2E, the PI generated spurious signals or periodic jitter which appear at a frequency offset from the carrier (e.g., clock frequency) are somewhat proportional to a frequency change desired or required by the use of the PLL and PI. The periodic jitter monotonically increases relative the absolute value of the PPM offset. In one or more embodiments, the desired or required frequency change is measured as a PPM offset (measured in PPM) from a relative frequency difference between a receiver (e.g., the receiver 280 in FIG. 2A) and a transmitter (e.g., the transmitter 220 in FIG. 2A). In one or more embodiments, the PPM offset is measured from a relative frequency difference between incoming data (e.g., the serial data 281 in FIG. 2A) and a reference clock (e.g., the reference clock 250 in FIG. 2A). In one or more embodiments, this PPM offset (e.g., representing a desired or required frequency offset) causes the non-ideal and non-linear PI to move phases, placing spurious signals inside the band of interest and manifesting the spurious signals as periodic jitter. In one or more embodiments, the PI generated spurious signals or period jitter are restricted to outside a band of interest by finely adjusting the PLL frequency. This shall be described with reference to FIG. 2F.

Figure 2F:
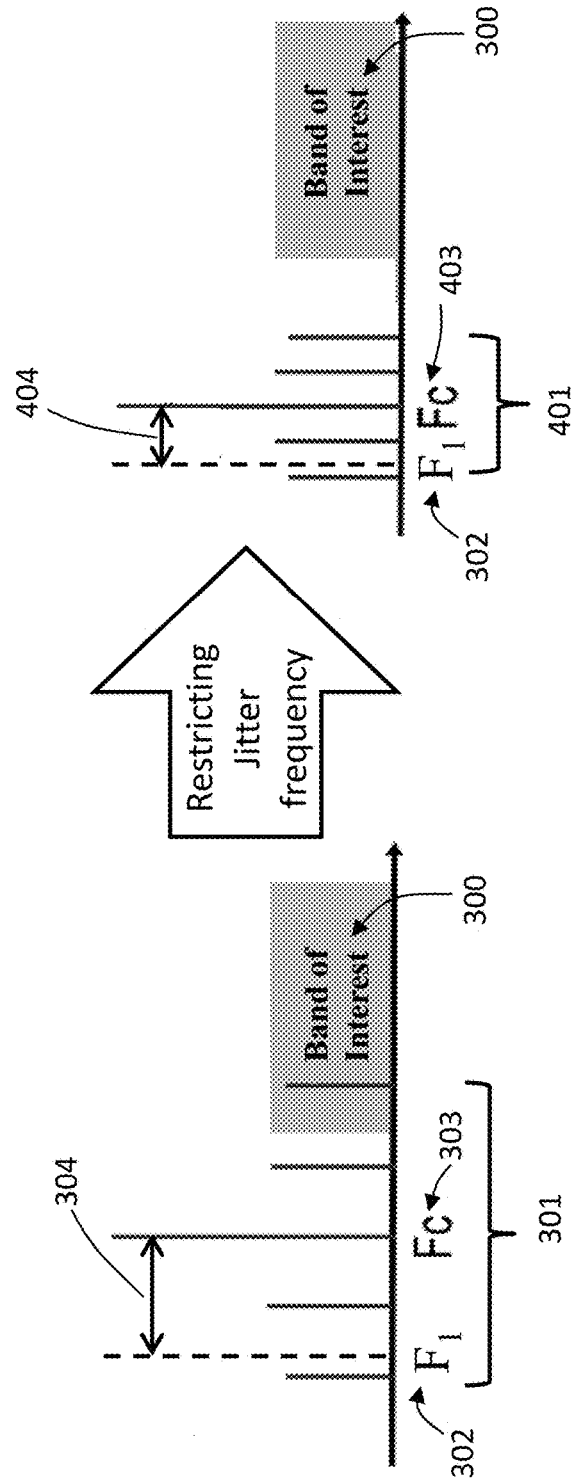
FIG. 2F is a block diagram depicting an embodiment of a method for restricting jitter to certain frequencies in a frequency spectrum.

FIG. 2F is a block diagram depicting an embodiment of a method for restricting jitter to certain frequencies in a frequency spectrum. As shown in the left diagram of FIG. 2F, a non-ideal and non-linear PI generates periodic jitter in a frequency range 301, some portion of which is inside a band of interest 300. As shown in the left diagram of FIG. 2F, in one or more embodiments, the PPM offset 304 is measured from a relative frequency difference between incoming data (e.g., the frequency $F_1$ of the incoming data at the location 302) and a reference clock (e.g., the frequency at the location 303).

In one or more embodiments, a PLL is configured to restrict jitter arising from a PI, to frequencies within a predefined bandwidth, by tuning a center frequency of the PLL to reduce the PPM offset of the PI. For example, as shown in the right diagram of FIG. 2F, in one or more embodiments, the PLL to restricts (or moves) jitter arising from the PI, to frequencies within a predefined bandwidth (e.g., frequency bandwidth 401), by tuning a center frequency $F_c$ of the PLL to reduce the PPM offset of the PI. As shown in FIG. 2F, the PPM offset 304 is reduced to the PPM offset 404 by tuning the center frequency $F_c$ of the PLL from the location 303 to the location 403.

In one or more embodiments, the PLL is further configured to reduce the PPM offset of the PI to a target value or to be within a target value range. For example, as shown in the right diagram of FIG. 2F, the PLL is configured to reduce the PPM offset 404 of the PI to a target value or to be within a target value range (e.g., the frequency range 401). In one or more embodiments, the PLL is further configured to reduce the jitter arising from the PI by reducing a frequency shift of the PI or a frequency shift required by the PI. For example, as shown in FIG. 2F, by reducing the PPM offset from the amount 304 to the amount 404, the PLL also reduces a frequency shift of the PI or a frequency shift required by the PI, one or more embodiments. That is, in one or more embodiments, after reducing the PPM offset to the amount 404, the PI is not required to perform a frequency shift as much as the amount 304.

In one or more embodiments, the PLL reduces the jitter arising from the PI by shifting a component of the jitter to reside outside of a predetermined frequency range. For example, as shown in FIG. 2F, the PLL reduces the jitter arising from the PI by shifting a component of the jitter (e.g., jitter in the frequency range 301) to reside outside of a predetermined frequency range (e.g., shifting the jitter in the frequency range 301 to the frequency range 401 outside the band of interest 300). In one or more embodiments, the PLL frequency (e.g., a center frequency of the PLL) is driven to be very close to a desired frequency, leaving only a small offset for the PI to introduce. For example, as shown in FIG. 2F, the center frequency Fc of the PLL is driven to be more close to the desired frequency (e.g., the frequency $F_1$ of the incoming data) in the right diagram than in the left diagram, leaving only a small and manageable offset for the PI to introduce (e.g., the PI can now introduce periodic jitter only in the frequency range 401). Referring to FIG. 2F, in one or more embodiments, because the PI operates at a very small offset (e.g., in the frequency range 401), the jitter that the PI generates is also small and outside the band of interest (e.g., the band of interest 300) so that the jitter generated by the PI is almost nonexistent, harmless or almost removed.

In one or more embodiments, the fractional-N PLL is further configured to tune a center frequency of the fractional-N PLL by adjusting the center frequency to or towards a desired frequency for transmitting outgoing data. For example, referring to FIG. 2A, in one or more embodiments, the PLL 260 tunes a center frequency of the PLL 260 (e.g., the center frequency of the VCO of the PLL 260) by adjusting the center frequency to or towards a desired frequency for transmitting outgoing data (e.g., for transmitting the serial data 222 by the transmitter 220).

In one or more embodiments, the effect of nonlinearities sourced in the PI (or a phase mover or phase rotator of the PI) is controlled by controlling a clock source using information extracted from a clock and phase error detector (e.g., the clock and phase error detector of the PI controller 248). In one or more embodiments, the clock source is an element that is targeting a specific frequency. In one or more embodiments, the frequency of the clock source is controlled by fractional control in which an analog filter (e.g., an analog filter of the PLL 260) is used at the input to the VCO of the PLL. In one or more embodiments, the frequency of the clock source is controlled by fractional control in which the offset to the reference clock to the PLL is achieved by applying a fractional division of the VCO's frequency and comparing the fractional division to the reference clock to generate a signal that drives the analog filter. In one or more embodiments, the frequency of the clock source is controlled by DAC control in which the analog filter is replaced by a DAC (e.g., the DAC 270). In one or more embodiments, the DAC is controlled by a digital frequency value or a phase and frequency comparator.

In one or more embodiments, the effect of nonlinearities sourced in the PI (or a phase mover or phase rotator of the PI) is controlled by controlling the phase mover or phase rotator of the PI. In one or more embodiments, the phase mover (or phase moving element) is capable of dynamically moving the phase of the generated clock from a clock source (e.g., the VCO of the PLL 260) while the phase mover generates phase distortions (e.g., because the steps in phase movement are quantized and are not exactly equal). In one or more embodiments, there are two types of non-linearities: differential non-linearities (DNLs) and integrated non-linearities (INLs). DNLs are step to step differences from an ideal step size. INLs are phase deviations from accuracy that are caused by accumulation of several step inaccuracies. In one or more embodiments, such non-linearities (DNLs or INLs) generate their distinct jitter. In one or more embodiments, a complete cycle of the PI (by going through all codes from beginning to end) generates harmonics based on the combination of the INLs and the DNLs. In one or more embodiments, when measuring the shapes of the INLs and DNLs, the shape of the INLs is more apparent than that of DNLs, while the DNLs mostly show itself whenever there is some localized stronger DNL. In one or more embodiments, the phase mover (or phase moving element) detects any phase or frequency offset between incoming serial data and a lock clock in a CDR (e.g., the CDR filter 290 in FIG. 2A).

In one or more embodiments, the effect of nonlinearities sourced in the PI (or a phase mover or phase rotator of the PI) is controlled by using the clock and phase error detector (e.g., a clock and phase error detector of the PI controller 248) so that the clock and phase error detector instructs the PI to move. In one or more embodiments, a phase offset detected by the clock and phase error detector generates a fixed and semi-static position of the PI, and then dithers between 2 or 3 positions. In one or more embodiments, a frequency offset detected by the clock and phase error detector causes the PI to constantly move (forward or backward) through all of its codes, thereby exposing the full INLs. In one or more embodiments, "banging" in a repeating manner on the DNL generates harmonics, every time a cycle of the PI is completed. In one or more embodiments, to control the frequency offset, the PLL frequency is changed to be closer to the incoming data frequency, resulting in a very small residual frequency offset (e.g., a very small PPM offset), causing the PI to rotate very slowly, and pushing the generated jitter closer to the carrier (e.g., reducing the frequency of jitter). In one or more embodiments, to control the frequency offset, the PPM offset is spread or modulated to generate a spread spectrum of harmonics to distribute or spread the frequencies of jitter even more. In one or more embodiments, to control the frequency offset, the PLL frequency is changed to be further away from the incoming data frequency, causing the PI to rotate very fast, and pushing the generated jitter further away from the carrier (e.g., increasing the frequency of jitter).

Figure 2G:
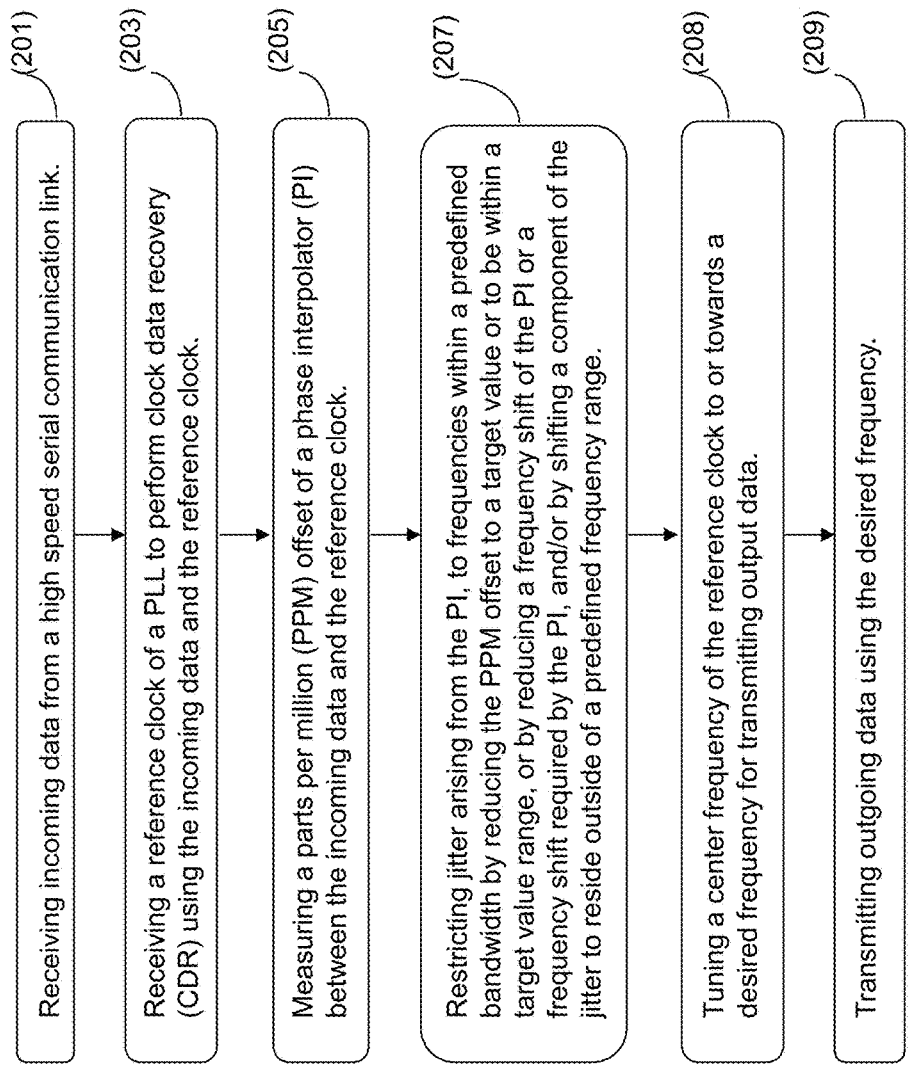
FIG. 2G is a flow diagram depicting an embodiment of a method for controlling the impact of periodic jitter caused by non-ideal PI(s).

Referring now to FIG. 2G, one illustrative embodiment of a method for controlling the impact of periodic jitter caused by non-ideal phase interpolators (PIs) is depicted. In one or more embodiments, the method includes receiving incoming data from a high speed serial communication link (operation 201). In one or more embodiments, a reference clock of a PLL is received to perform clock data recovery using the incoming data and the reference clock (operation 203). In one or more embodiments, a parts per million (PPM) offset of a phase interpolator (PI) is measured between the incoming data and the reference clock (operation 205). In one or more embodiments, jitter arising from the PI is restricted to frequencies within a predefined bandwidth (operation 207). The jitter is restricted by reducing the PPM offset to a target value or to be within a target value range, in one or more embodiments. The jitter is restricted by reducing a frequency shift of the PI or a frequency shift required by the PI, in one or more embodiments. In one or more embodiments, the jitter is restricted by shifting a component of the jitter to reside outside of a predefined frequency range. In one or more embodiments, a center frequency of the PLL is tuned to or towards a desired frequency for transmitting output data (operation 208). In one or more embodiments, outgoing data is transmitted using the desired frequency (operation 209).

Referring now to operation 201, and in one or more embodiments, a receiver is implemented for operation to receive incoming data from a high speed serial communication link. For example, the receiver 280 receives the serial data 291 as incoming data (see FIG. 2A). In one or more embodiments, the high speed serial communication link includes serial cables such as serial SCSI, Ethernet ports, DVI ports or HDMI ports, and serial computer buses.

Referring now to operation 203, and in one or more embodiments, a reference clock of a PLL is received to perform CDR using the incoming data and the reference clock. For example, the reference clock 250 of the PLL 260 is received to perform CDR using the incoming data 281 and the reference clock 250 (see FIG. 2A). A reference clock of a fractional-N phase-locked loop (PLL) is received, in one or more embodiments. For example, the PLL 260 is a fractional-N PLL.

Referring now to operation 205, and in one or more embodiments, a PPM offset of a PI is measured between the incoming data and the reference clock. For example, the measurement circuitry in the CDR filter 290 measures a PPM offset of the PI 245 or the PI 240 between the incoming data (e.g., the serial data 281) and the reference clock (e.g., the reference clock 250). In one or more embodiments, the measurement circuitry is included in the clock and phase error detector of the PI controller 248 (see FIG. 2A).

In one or more embodiments, the measurement circuitry measures the PPM offset by monitoring the average movement per second of the PI (e.g., the PI 240 or the PI 245), divided down by the number of steps for a complete clock cycle of data (e.g., the incoming data 281), and calculating the average frequency offset between the incoming data and a local clock as the PPM offset.

Referring now to operation 207, and in one or more embodiments, jitter arising from the PI is restricted to frequencies within a predefined bandwidth. For example, the PLL 260 is configured to restrict the jitter by reducing the PPM offset to a target value (e.g., reducing the PPM offset 304 to the PPM offset 404; see FIG. 2F) or to be within a target value range (e.g., the frequency range 401 in FIG. 2F). The jitter is restricted by reducing a frequency shift of the PI or a frequency shift required by the PI, in one or more embodiments. For example, the PLL 260 is configured to restrict the jitter by reducing a frequency shift of the PI or a frequency shift required by the PI (e.g., the desired frequency shift amount 304 is reduced to the amount 404; see FIG. 2F). In one or more embodiments, the jitter is restricted by shifting a component of the jitter to reside outside of a predefined frequency range. For example, the PLL 260 is configured to restrict the jitter by shifting at least a component of the jitter (e.g., a portion of jitter frequency range 401 in FIG. 2F) to reside outside of a predefined frequency range (e.g., the band of interest 300 in FIG. 2F).

In one or more embodiments, jitter arising from the PI is restricted to frequencies within a predefined bandwidth, by tuning a center frequency of the fractional-N PLL to reduce the PPM offset of the PI. For example, the PLL 260 is configured to restrict the jitter by tuning a center frequency of the PLL 260 (e.g., the center frequency $F_c$ in FIG. 2F) to reduce the PPM offset of the PI (see FIG. 2F). In one or more embodiments, a fractional-N PLL is tuned (or adjusted or set) to minimize a necessary PI frequency shift or otherwise place spurious signals or jitters caused by the PI to a location where they are harmless (e.g., free of interference with a band of interest). In one or more embodiments, the following algorithm is performed: (1) waking up the system (e.g., the system 2000 in FIG. 2A); (2) measuring a frequency difference or offset (e.g., a PPM offset) between the incoming data and a local PLL frequency; (3) setting a fractional-N to update a PLL center frequency to be closer to the minima (e.g., a predefined target offset ratio or any target frequency) to compensate the PPM offset; and/or (4) either rebooting the system with the updated PLL center frequency, or if possible, tuning the PLL's Fractional-N configuration to minimize the effective PPM offset or to restrict the PPM offset at a target PPM offset (see FIG. 2F). Using the above-noted algorithm, in one or more embodiments, a required PI frequency shift and the spurious signals (jitter) generated thereby are placed in a frequency range (e.g., the range 401 in FIG. 2F) where they have a smaller impact on a band of interest (e.g., a band of the communications link).

In one or more embodiments, jitter arising from the PI is restricted to frequencies within a predefined bandwidth, by tuning a center frequency of the PLL using a DAC to reduce the PPM offset of the PI, in one or more embodiments. For example, the PLL 260 tunes a center frequency of the PLL (e.g., the center frequency $F_c$ in FIG. 2F) using a DAC (e.g., the DAC 270) to reduce the PPM offset of the PI (e.g., reducing the PPM offset 304 to the PPM offset 404 in FIG. 2F). In restricting jitter arising from the PI, to frequencies within a predefined bandwidth, a configuration of the DAC is set in a continuous mode, in one or more embodiments. For example, the configuration of the DAC 270 is set in a continuous mode by finding a correct digital value, which is then translated to a voltage, and using a phase error detector (e.g., the clock and phase error detector of the PI controller 248 or the clock and phase error detector of the CDR filter 290) as feedback to close the control loop of steadying the PLL's frequency to a known ratio to the reference clock. In one or more embodiments, to change the DAC setting to offset the reference loop of the PLL, the following algorithm is performed: (1) waking up the system (e.g., the system 2000 in FIG. 2A); (2) measuring a frequency difference (or PPM offset) between the incoming data and a local PLL frequency; and/or (3) setting the DAC to compensate the PPM offset by "stirring" the PLL's DAC configuration to minimize the effective PPM offset or to restrict the PPM offset at a target PPM offset. In one or more embodiments, the stirring is performed by employing a second source of feedback, which generates a frequency offset compared to an initial condition when a single source of feedback was employed (and the single source has a fixed ratio of the PLL to the reference clock without any input of the PPM offset from the CDR filter or the PI controller). In one or more embodiments, the step (3) is performed in a slow control loop in continuous mode. Using the above-noted algorithm, in one or more embodiments, the PI movement is slowed down (or a lower number of compensation cycles is achieved), and the periodic jitter is hidden or separated from a band of interest (e.g., a band of the communications link).

Referring now to operation 208, and in one or more embodiments, a center frequency of the PLL is tuned to or towards a desired frequency for transmitting output data. For example, a center frequency of the PLL 260 is tuned to or towards a desired frequency for transmitting output data (e.g., the serial data 222 transmitted by the transmitter 220; see FIG. 2A).

Referring now to operation 209, and in one or more embodiments, outgoing data is transmitted using the desired frequency. For example, the transmitter 220 transmits the serial data 222 (see FIG. 2A) using the desired frequency previously tuned to by the PLL 260 in operation 208.

It should be noted that certain passages of this disclosure can reference terms such as "first" and "second" in connection with devices, frequencies, etc., for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities (e.g., devices) that can operate within a system or environment.

It should be understood that the systems described above can provide multiple ones of any or each of those components and these components can be provided on either a standalone machine or, in one or more embodiments, on multiple machines in a distributed system. In addition, the systems and methods described above can be provided as one or more computer-readable programs or executable instructions embodied on or in one or more articles of manufacture. The article of manufacture can be a floppy disk, a hard disk, a CD-ROM, a flash memory card, a PROM, a RAM, a ROM, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. A method for controlling periodic jitter arising from a phase interpolator (PI), comprising:
   receiving incoming data;
   receiving a reference clock of a fractional-N phase-locked loop (PLL), wherein N is an integer;
   measuring a parts per million (PPM) offset between the incoming data and the reference clock, of a first PI; and
   restricting jitter arising from the first PI, to frequencies within a predefined bandwidth, by tuning a center frequency of the fractional-N PLL to reduce the PPM offset of the first PI, wherein the jitter arising from the first PI comprises jitter arising from non-linear phases of the first PI.

2. The method of claim 1, further comprising reducing the PPM offset of the first PI to a target value or to be within a target value range.

3. The method of claim 1, further comprising reducing the jitter arising from the first PI by reducing a frequency shift of the first PI or a frequency shift required by the first PI.

4. The method of claim 1, further comprising reducing the jitter arising from the first PI by shifting a component of the jitter to reside outside of a predefined frequency range.

5. The method of claim 1, further comprising performing clock and data recovery (CDR) using the incoming data and the reference clock.

6. The method of claim 1, wherein receiving the incoming data comprises receiving the incoming data from a high speed serial communications link.

7. The method of claim 1, wherein tuning a center frequency of the fractional-N PLL comprises adjusting the center frequency to or towards a desired frequency for transmitting outgoing data.

8. A method for controlling periodic jitter arising from a phase interpolator (PI), comprising:
   receiving incoming data;
   receiving a reference clock of a phase-locked loop (PLL);
   measuring a parts per million (PPM) offset between the incoming data and the reference clock, of a first PI; and
   restricting jitter arising from the first PI, to frequencies within a predefined bandwidth, by tuning a center frequency of the PLL using a digital-analog converter (DAC) to reduce the PPM offset of the first PI, wherein the jitter arising from the first PI comprises jitter arising from non-linear phases of the first PI.

9. The method of claim 8, further comprising reducing the PPM offset of the first PI to a target value or to be within a target value range.

10. The method of claim 8, further comprising reducing the jitter arising from the first PI by reducing a frequency shift of the first PI or a frequency shift required by the first PI.

11. The method of claim 8, further comprising reducing the jitter arising from the first PI by shifting a component of the jitter to reside outside of a predetermined frequency range.

12. The method of claim 8, further comprising performing clock and data recovery (CDR) using the incoming data and the reference clock.

13. The method of claim 8, wherein receiving the incoming data comprises receiving the incoming data from a high speed serial communications link.

14. The method of claim 8, wherein restricting jitter arising from the first PI, to frequencies within a predefined bandwidth comprises setting a configuration of the DAC in a continuous mode.

15. A system for controlling periodic jitter arising from a phase interpolator (PI), comprising:
   a receiver configured to receive incoming data;
   a fractional-N phase-locked loop (PLL) configured to receive a reference clock, wherein N is an integer; and
   measurement circuitry configured to measure a parts per million (PPM) offset between the incoming data and the reference clock, of a first PI,
   wherein the fractional-N PLL is further configured to restrict jitter arising from the first PI, to frequencies within a predefined bandwidth, by tuning a center frequency of the fractional-N PLL to reduce the PPM offset of the first PI, wherein the jitter arising from the first PI comprises jitter arising from non-linear phases of the first PI.

16. The system of claim 15, wherein the fractional-N PLL is further configured to reduce the PPM offset of the first PI to a target value or to be within a target value range.

17. The system of claim 15, wherein the fractional-N PLL is further configured to reduce the jitter arising from the first PI by reducing a frequency shift of the first PI or a frequency shift required by the first PI.

18. The system of claim 15, wherein the fractional-N PLL is further configured to reduce the jitter arising from the first PI by shifting a component of the jitter to reside outside of a predetermined frequency range.

19. The system of claim 15, wherein the receiver is further configured to receive the incoming data from a high speed serial communications link.

20. The system of claim 15, wherein the fractional-N PLL is further configured to tune a center frequency of the fractional-N PLL by adjusting the center frequency to or towards a desired frequency for transmitting outgoing data.

* * * * *